US006486940B1

(12) United States Patent
Williamson

(10) Patent No.: US 6,486,940 B1
(45) Date of Patent: Nov. 26, 2002

(54) HIGH NUMERICAL APERTURE CATADIOPTRIC LENS

(75) Inventor: David M. Williamson, West Malvern (GB)

(73) Assignee: SVG Lithography Systems, Inc., Wilton, CT (US)

( * ) Notice: Subject to any disclaimer, the term of this patent is extended or adjusted under 35 U.S.C. 154(b) by 97 days.

(21) Appl. No.: 09/620,886

(22) Filed: Jul. 21, 2000

(51) Int. Cl.[7] .................. G03B 27/54; G03B 27/42; G02B 17/00; G02B 21/00
(52) U.S. Cl. ............... 355/67; 355/53; 359/727; 359/365
(58) Field of Search ............... 359/365, 366, 359/726, 727, 631; 355/67, 53; 356/399, 400, 401

(56) References Cited

U.S. PATENT DOCUMENTS

| | | |
|---|---|---|
| 3,917,399 A | 11/1975 | Buzawa et al. |
| 4,896,952 A | 1/1990 | Rosenbluth |
| 4,953,960 A | 9/1990 | Williamson |
| 5,089,913 A | 2/1992 | Singh et al. |
| 5,212,593 A | 5/1993 | Williamson et al. |
| 5,220,454 A | 6/1993 | Ichihara et al. |
| 5,537,260 A | 7/1996 | Williamson |
| 5,966,216 A | * 10/1999 | Galburt et al. ............. 356/401 |

FOREIGN PATENT DOCUMENTS

| | | |
|---|---|---|
| DE | 41 10 296 A 1 | 10/1991 |
| DE | 42 03 464 A 1 | 8/1992 |
| JP | 05-088087 | 4/1993 |

* cited by examiner

Primary Examiner—Russell Adams
Assistant Examiner—Peter B. Kim
(74) Attorney, Agent, or Firm—Fattibene & Fattibene; Paul A. Fattibene; Arthur T. Fattibene

(57) ABSTRACT

A catadioptric projection optical system for use in photolithography used in manufacturing semiconductors having a quarter waveplate following a reticle and multiple aspheric surfaces and calcium fluoride lens elements. A quarter waveplate following the reticle eliminates asymmetry in reticle diffraction caused by polarized illumination. The use of additional aspheric surfaces reduces the number of lens elements and aids in reducing aberrations. Calcium fluoride elements are used in the lens group adjacent the wafer to help minimize compaction. In one embodiment, only calcium fluoride material is used. The present invention provides a projection optics system having a numerical aperture of 0.75 for use with wavelengths in the 248, 193, and 157 nanometer range. The object and image locations are separated by a predetermined distance, making possible retrofitting of older optical systems. The present invention is particularly suited for use in semiconductor manufacturing and has improved imaging with less aberrations, particularly at shorter wavelengths.

20 Claims, 5 Drawing Sheets

HIGH NUMERICAL APERTURE CATADIOPTRIC LENS

FIELD OF THE INVENTION

The present invention relates generally to projection optics used in semiconductor manufacturing equipment, and particularly to a catadioptric projection optic system having a high numerical aperture used with short wavelengths.

BACKGROUND OF THE INVENTION

In semiconductor manufacturing, photolithography techniques are often used. These photolithography techniques require the image of a reticle to be projected onto a wafer or photosensitive substrate. Relatively complicated projection optics are often used to project the image of the reticle onto the wafer or photosensitive substrate. The projection optics are required to provide a very high quality image of the reticle so that very small feature sizes on the reticle can be imaged accurately with very little aberrations. The projection optics often provide a magnification less than one resulting in a reduced image. Often, only a small portion of the image field is utilized that has the best imaging qualities. However, it is desirable to provide as large an image field as possible to enhance throughput and increase production of semiconductor devices. With the tremendous demand for decreased feature sizes in combination with higher throughput, new and improved projection optical systems are continually needed. Because of the ever decreasing feature sizes demanded by the semiconductor manufacturing industry, projection optics are needed that have higher numerical apertures and that are designed to operate at shorter wavelengths. Current optical designs cannot meet the demands of the manufacturers of semiconductors. For example, a prior optical system is disclosed in U.S. Pat. No. 4,953,960 entitled "Optical Reduction System" issuing Sep. 4, 1990 to Williamson. Therein disclosed is an optical reduction system operating in the wavelength range of 248 nanometers and having a numerical aperture of 0.45. Another projection optical system is disclosed in U.S. Pat. No. 5,089,913 entitled "High Resolution Reduction Catadioptric Relay Lens" issuing Feb. 18, 1992 to Singh et al, which is herein incorporated by reference. Therein disclosed is an optical system having a restricted spectral wavelength at 248 nanometers and having a numerical aperture of 0.6. Another projection optics system is disclosed in U.S. Pat. No. 5,537,260 entitled "Catadioptric Optical Reduction System With High Numerical Aperture" issuing Jul. 16, 1996 to Williamson, which is herein incorporated by reference. Therein disclosed is a projection optics system having a numerical aperture of 0.7 with different embodiments operating in wavelengths ranging from 360 to 193 nanometers. While these optical systems have operated adequately, there is a need for a projection optics used in semiconductor manufacturing to reproduce feature sizes substantially smaller than those of current systems.

SUMMARY OF THE INVENTION

The present invention comprises a catadioptric optical system using multiple aspheric surfaces improving performance and reducing the number of lens elements. Calcium fluoride lens elements are used in a lens group closest to the wafer or photosensitive substrate. A zero-order quarter waveplate is positioned after the reticle and before a lens group having at least one aspheric surface prior to a beamsplitter. An aspheric concave mirror is placed adjacent the beamsplitter and adjacent a surface perpendicular to the lens group. Another lens group is positioned adjacent the beamsplitter opposing the aspheric concave mirror having a majority of the lens elements made of calcium fluoride and imaging the reticle at the wafer or photosensitive substrate. A relatively high numerical aperture of 0.75 is obtained, and in one embodiment a wavelength of 157 nanometers is utilized.

Accordingly, it is an object of the present invention to provide a projection optic system with a higher numerical aperture than current projection optic systems.

It is a further object of the present invention to decrease the lens elements of the projection optic system.

It is yet a further object of the present invention to prevent asymmetry in reticle diffraction caused by polarized illumination.

It is an advantage of the present invention that it results in reduced aberrations.

It is a further advantage of the present invention that reduced feature sizes can be imaged.

It is yet a further advantage of the present invention that it uses circular polarized electromagnetic radiation through the reticle.

It is a feature of the present invention that it uses calcium fluoride as a lens material in a lens group near the wafer.

It is another feature of the present invention that multiple aspheric lens elements are used.

It is yet another feature of the present invention that a zero-order quarter waveplate is positioned after the reticle.

These and other objects, advantages, and features will be readily apparent in view of the following description.

DETAILED DESCRIPTION OF THE PREFERRED EMBODIMENTS

Figure 1:
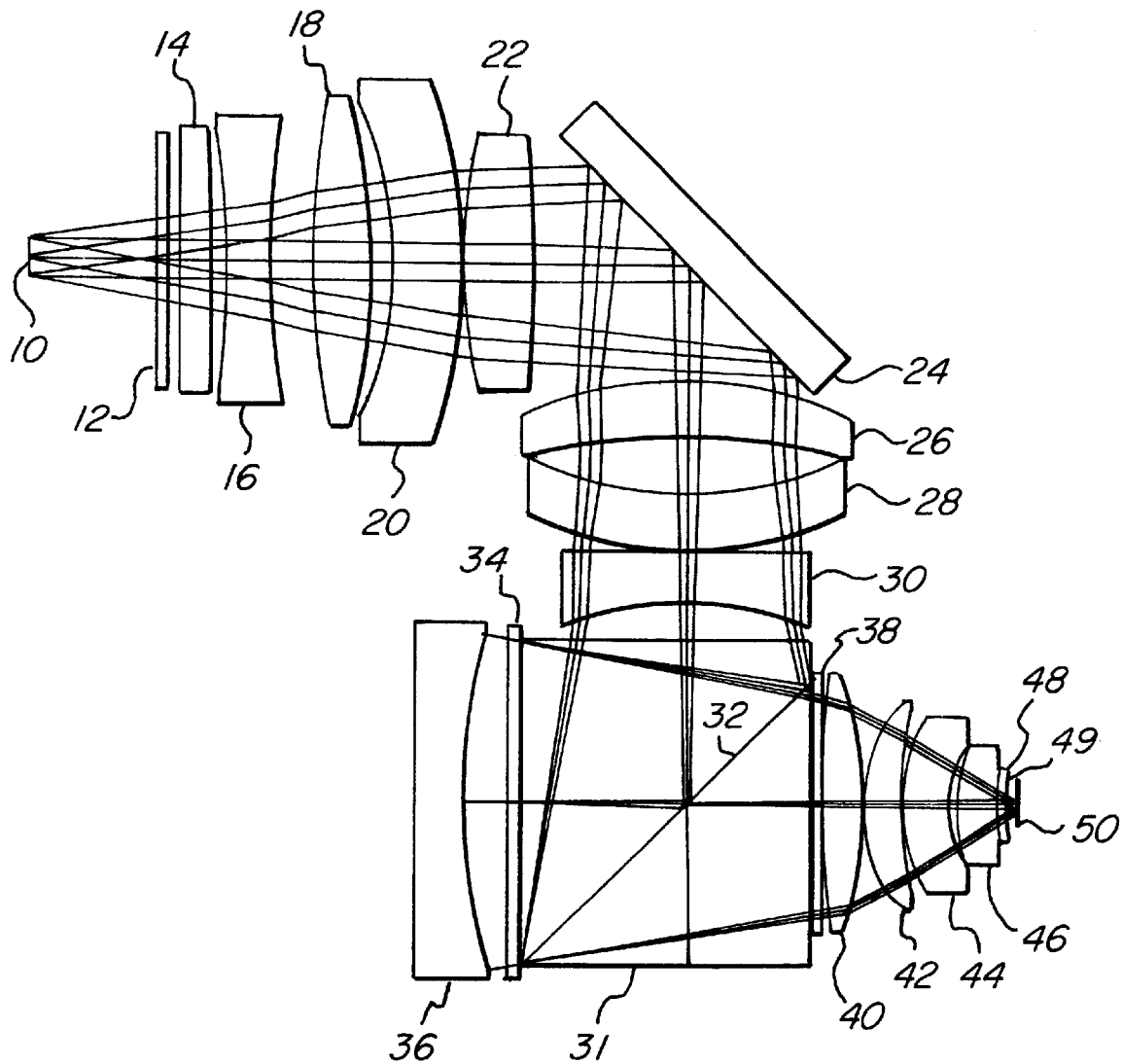
FIG. 1 schematically illustrates one embodiment of the present invention designed for use with 248 nanometer wavelength electromagnetic radiation.

FIG. 1 illustrates a first embodiment of the present invention. A reticle 10 is positioned at an object location and a wafer or photosensitive surface or substrate 50 is positioned at an image location. The projection optics between the reticle 10 and wafer or photosensitive substrate 50 provides a magnification of less than one or a reduction ratio of approximately 4 to 1. The embodiment illustrated in FIG. 1 has a numerical aperture of 0.75, a 26×5 mm field at the wafer or photosensitive substrate 50 used with 248 nanometer wavelength electromagnetic radiation over a spectral bandwidth of 40 pecometers full-width-half maximum, FWHM. Following the reticle 10 is a first quarter waveplate 12. Quarter waveplate 12 is preferably a zero-order quarter waveplate. This zero-order quarter waveplate 12 allows circularly polarized light to be used through the reticle avoiding diffraction asymmetry resulting from the relative orientation of reticle features and light polarization vector. Following the quarter waveplate 12 is a planar-convex lens 14. Following the planar-convex lens 14 is a bi-concave lens 16. Following lens 16 is a bi-convex lens 18, a meniscus lens 20, and a bi-convex lens 22. Following this first lens group is a fold mirror 24. Following the fold mirror 24 is a meniscus lens 26. Following the meniscus lens 26 is an aspheric lens 28. Aspheric lens 28 has a spherical concave surface and an aspherical convex surface. Following aspheric lens 28 is a bi-concave lens 30. Following this lens group, after the fold mirror 24, is a beamsplitter 31. Beamsplitter 31 has a partially reflective surface 32. Adjacent one surface of the beamsplitter 31 is a quarter waveplate 34 followed by a concave aspheric mirror 36. The quarter waveplate 34 is preferably a zero-order quarter waveplate. Adjacent the opposing surface of the beamsplitter 31 is another quarter waveplate 38, a bi-convex lens 40, and a meniscus lens 42. The quarter waveplate 38 is also preferably a zero-order quarter waveplate. The lens 40 and lens 42 are made of calcium fluoride. Following lens 42 is a meniscus lens 44 made of silica. Following meniscus lens 44 is a meniscus lens 46 and a meniscus lens 48. Lenses 46 and 48 are made of calcium fluoride. Following lens 48 is a plate 49. The third lens group between the beamsplitter 31 and the wafer or photosensitive substrate 50 have elements made form calcium fluoride, with the exception of lens 44, the quarter waveplate 38, and plate 49. This embodiment uses calcium fluoride in a majority of the lens elements in this lens group after the beamsplitter 31. This embodiment, designed for operation at 248 nanometer wavelengths, has the advantage of providing a high numerical aperture in a package that has a distance between the reticle 10 and wafer or photosensitive substrate 50 of a predetermined distance. This predetermined conjugate distance is advantageous in using this embodiment as a replacement for optical systems of earlier designs having the same predetermined conjugate distance.

In a preferred configuration the optical system, illustrated in FIG. 1, may be made according to the construction data of the following Tables 1 and 1A.

TABLE 1

| Element Number | Radius of Curvature(Front)mm | Radius of Curvature(Back)mm | Thickness mm | Glass |
|---|---|---|---|---|
| 10 | Infinite | | 71.0257 | |
| 12 | Infinite | Infinite | 6.0000 | Silica |
| space | | | 6.0000 | |
| 14 | Infinite | −1637.5100 CX | 17.8788 | Silica |
| space | | | 7.6907 | |
| 16 | −507.9899 CC | 425.0110 CC | 23.6604 | Silica |
| space | | | 23.6491 | |
| 18 | 482.8744 CX | −334.9535 CX | 32.3037 | Silica |
| space | | | 12.0839 | |
| 20 | −210.1022 CC | −342.7380 CX | 35.5779 | Silica |
| space | | | 1.5001 | |
| 22 | 254.8364 CX | −1377.8565 CX | 38.5079 | Silica |
| space | | | 83.5499 | |
| 24 | Infinite | | −64.0738 | Reflector |
| 26 | −200.6185 CX | −294.6182 CC | −30.0000 | Silica |
| space | | | −33.6639 | |
| 28 | A(1) | 207.0105 CX | −30.2428 | Silica |
| space | | | −1.9989 | |
| 30 | 2223.6648 CC | −166.4311 CC | −27.4282 | Silica |
| space | | | −21.5924 | |
| 31 | Infinity | Infinity | −91.0000 | Silica |
| 32 | Infinity | | | Reflector |
| 31 | Infinity | Infinity | 91.0000 | Silica |
| space | | | 1.7156 | |
| 34 | Infinity | Infinity | 6.000 | Silica |
| space | | | 23.3211 | |
| 36 | A(2) | | −23.3211 | Reflector |
| 34 | Infinity | Infinity | −6.000 | Silica |
| space | | | −1.7156 | |
| 31 | Infinity | Infinity | −91.0000 | Silica |
| 31 | Infinity | Infinity | −68.0000 | Silica |
| space | | | −1.7156 | |
| 38 | Infinity | Infinity | −4.4503 | Silica |
| space | | | −0.5000 | |
| 40 | −627.6194 CX | 211.4176 CX | −21.5127 | $CaF_2$ |
| space | | | −0.5000 | |
| 42 | −87.2228 CX | −200.3029 CC | −19.1435 | $CaF_2$ |
| space | | | −0.5000 | |
| 44 | −91.9856 CX | −59.4578 CC | −27.1671 | Silica |
| space | | | −2.9551 | |
| 46 | −73.3403 CX | −160.4650 CC | −21.3988 | $CaF_2$ |
| space | | | −1.4194 | |
| 48 | −126.8033 CX | −368.0257 CC | −5.2755 | $CaF_2$ |
| space | | | −1.0000 | |
| 49 | Infinity | Infinity | −0.9000 | Silica |
| | Image Distance = | | −2.3000 | |
| 50 | Infinity | | | |

The aspheric constants are provided according to the following equation and Table 1A

TABLE 1A $$z = \frac{(curv)y^2}{1+(1-(1+K)(curv)^2 y^2)^{1/2}} + (A)y^4 + (B)y^6 + (C)y^8 + (D)y^{10} + (E)y^{12} + (F)y^{14} + (G)y^{16} + (H)y^{18} + (J)y^{20}$$

| Aspheric | Curv | K | A | B | C | D |
|---|---|---|---|---|---|---|
| A(1) | 0.00497390 | 0.000000 | 2.35640E−08 | −7.81654E−14 | −4.40789E−17 | 2.12263E−20 |
| A(2) | −0.00289239 | 0.000000 | 2.36370E−09 | 1.65324E−13 | 7.69607E−18 | 9.96953E−23 |

| | E | F | G | H | J |
|---|---|---|---|---|---|
| A(1) | −6.05312E−24 | 9.94327E−28 | −8.75026E−28 | 3.18657E−36 | 0.00000E+00 |
| A(2) | 4.61249E−26 | −3.24220E−30 | 2.06573E−34 | −4.86011E−40 | 0.00000E+00 |

Figure 2:
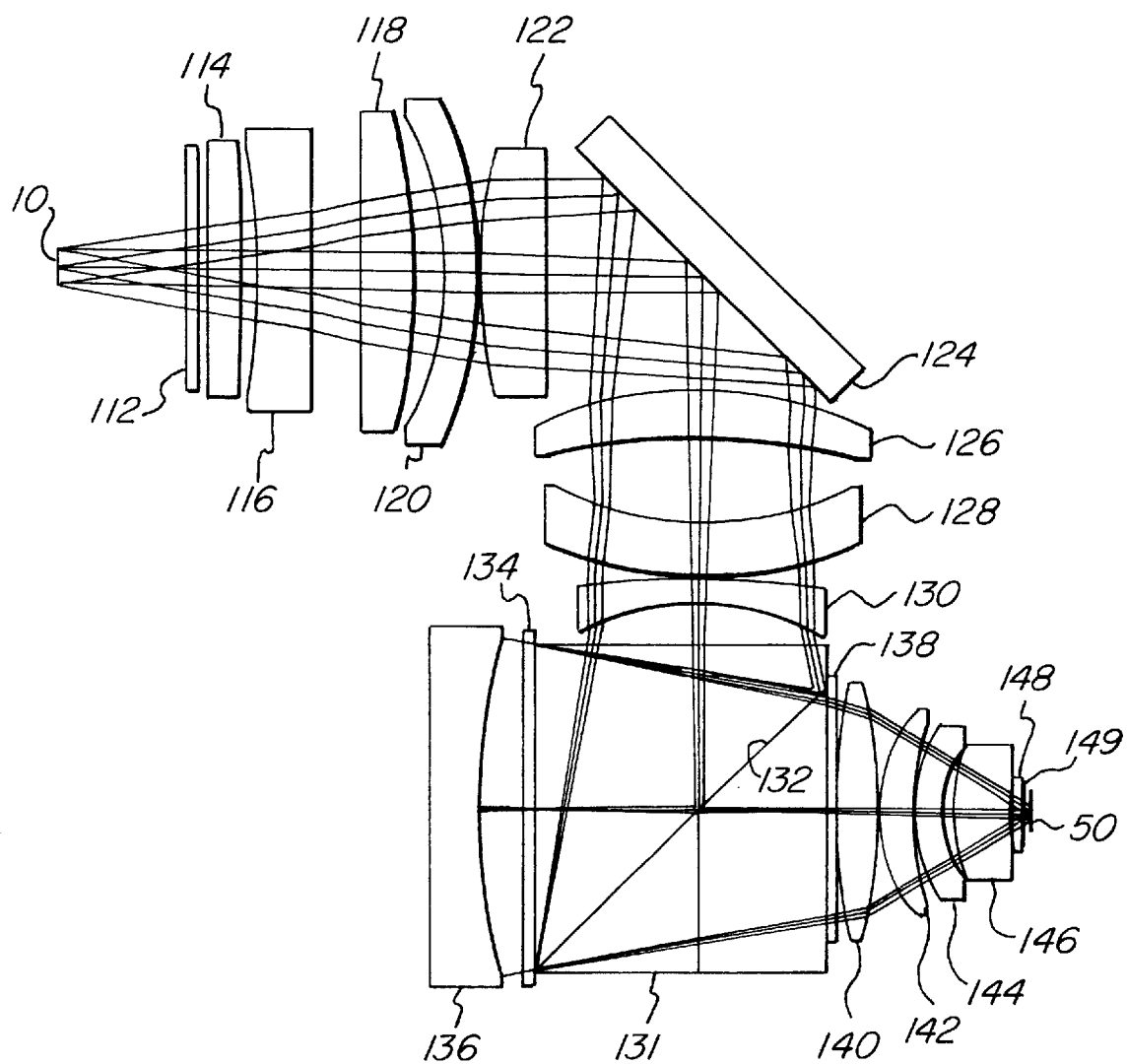
FIG. 2 schematically illustrates a second embodiment of the present invention designed for use with 193 nanometer wavelength electromagnetic radiation and having two aspheric surfaces.

FIG. 2 illustrates a second embodiment of a projection optics system having a numerical aperture of 0.75, a 26×5 mm field at the wafer, using 193 nanometer wavelength electromagnetic radiation over a spectral bandwidth of 25 picometers full-width-half maximum. Following reticle 10 is a zero-order quarter waveplate 112, a planar convex lens 114, a bi-concave lens 116, a meniscus lens 118, a meniscus lens 120, and a bi-convex lens 122. After this lens group a fold mirror 124 is positioned. Following fold mirror 124 is a meniscus lens 126, an aspheric lens 128 and a meniscus lens 130. The aspheric lens 128 has an aspheric concave surface and a spherical convex surface. Following this lens group, after fold mirror 124, is a beamsplitter 131. Beamsplitter 131 has a partially reflective surface 132. Adjacent one side of the beamsplitter 131 is a second quarter waveplate 134. The second quarter waveplate 134 is preferably a zero-order quarter waveplate. Following second quarter waveplate 134 is an aspheric concave mirror 136. Adjacent an opposing surface of the beamsplitter 131 is a third quarter waveplate 138. This third quarter waveplate 138 is also preferably a zero-order quarter waveplate. Following the third quarter waveplate 138 is a bi-convex lens 140, a meniscus lens 142, a meniscus lens 144, a meniscus lens 146, a meniscus lens 148, and a plate 149. Lenses 18, 19, 20, 21, and 22 are made of calcium fluoride. Adjacent the plate 149 is wafer 50 positioned at the image location. In this embodiment, the use of calcium fluoride lenses or elements between the second quarter waveplate 138 and the plate 149 greatly minimizes compaction or radiation induced change in the refractive index. This lens group is particularly susceptible to compaction due to the relatively small beam sizes and high flux density. This embodiment utilizes two aspheric surfaces. The use of aspheric surfaces is advantageous in that the number of lens elements is reduced.

In a preferred configuration the optical system, illustrated in FIG. 2, may be made according to the construction data of the following Tables 2 and 2A.

TABLE 2

| Element Number | Radius of Curvature(Front)mm | Radius of Curvature(Back)mm | Thickness mm | Glass |
|---|---|---|---|---|
| 10 | Infinite | | 71.0257 | |
| 112 | Infinity | Infinity | 6.0000 | Silica |
| space | | | 6.0014 | |
| 114 | Infinity | −1637.5100 CX | 17.8788 | Silica |
| space | | | 9.1702 | |

TABLE 2-continued

| Element Number | Radius of Curvature(Front)mm | Radius of Curvature(Back)mm | Thickness mm | Glass |
|---|---|---|---|---|
| 116 | −433.0968 CC | 2598.0412 CC | 29.3027 | Silica |
| space | | | 28.9382 | |
| 118 | −5578.3482 CC | −382.9273 CX | 29.8579 | Silica |
| space | | | 16.6017 | |
| 120 | −189.0676 CC | −239.8621 CX | 18.0000 | Silica |
| space | | | 1.5014 | |
| 122 | 259.603 CX | −2163.768 CX | 37.8249 | Silica |
| space | | | 86.0743 | |
| 124 | Infinity | | −64.0738 | Reflector |
| 126 | −200.8102 CX | −363.2248 CC | −28.2406 | Silica |
| space | | | −48.5160 | |
| 128 | A(1) | 215.5519 CX | −30.2428 | Silica |
| space | | | −2.0011 | |
| 130 | −718.0642 CX | −142.9228 CC | −12.1060 | Silica |
| space | | | −23.8197 | |
| 131 | Infinity | Infinity | −91.0000 | Silica |
| 132 | Infinity | | | Reflector |
| 131 | Infinity | Infinity | 91.0000 | Silica |
| space | | | 1.7156 | |
| 134 | Infinity | Infinity | 6.0000 | Silica |
| space | | | 25.1737 | |
| 136 | A(2) | | −25.1737 | Reflector |
| 134 | Infinity | Infinity | −6.0000 | Silica |
| space | | | −1.7156 | |
| 131 | Infinity | Infinity | −91.0000 | Silica |
| 131 | Infinity | Infinity | −68.000 | Silica |
| space | | | −1.7156 | |
| 138 | Infinity | Infinity | −4.4503 | Silica |
| space | | | −0.5000 | |
| 140 | −366.1837 CX | 259.6264 CX | −22.6130 | $CaF_2$ |
| space | | | −0.5000 | |
| 142 | −85.8999 CX | −176.3075 CC | −19.0232 | $CaF_2$ |
| space | | | −0.5000 | |
| 144 | −86.4495 CX | −64.6738 CC | −15.3239 | $CaF_2$ |
| space | | | −5.5180 | |
| 146 | −100.7188 CX | −180.9651 CC | −31.1363 | $CaF_2$ |
| space | | | −1.2329 | |
| 148 | −138.0675 CX | −502.9595 CC | −5.2755 | $CaF_2$ |
| space | | | −1.0000 | |
| 149 | Infinity | Infinity | −0.9000 | Silica |
| | Image Distance = | | −2.3000 | |
| 50 | Infinity | | | |

The aspheric constants are provided according to the following equation and Table 2A

TABLE 2A $$z = \frac{(curv)y^2}{1 + (1 - (1+K)(curv)^2 y^2)^{1/2}} + (A)y^4 + (B)y^6 + (C)y^8 + (D)y^{10} + (E)y^{12} + (F)y^{14} + (G)y^{16} + (H)y^{18} + (J)y^{20}$$

| Aspheric | Curv | K | A | B | C | D |
|---|---|---|---|---|---|---|
| A(1) | 0.00576125 | 0.000000 | 3.60293E−09 | −4.18487E−13 | −4.80164E−17 | 1.86225E−20 |
| A(2) | −0.00288476 | 0.000000 | 1.74269E−09 | 1.17255E−13 | 6.94898E−18 | −2.48358E−22 |

| | E | F | G | H | J |
|---|---|---|---|---|---|
| A(1) | −5.22691E−24 | 8.72143E−28 | −7.89947E−32 | 2.97093E−36 | 0.00000E+00 |
| A(2) | 7.10580E−26 | −5.86680E−30 | 3.49595E−34 | −6.83625E−39 | 0.00000E+00 |

Figure 3:
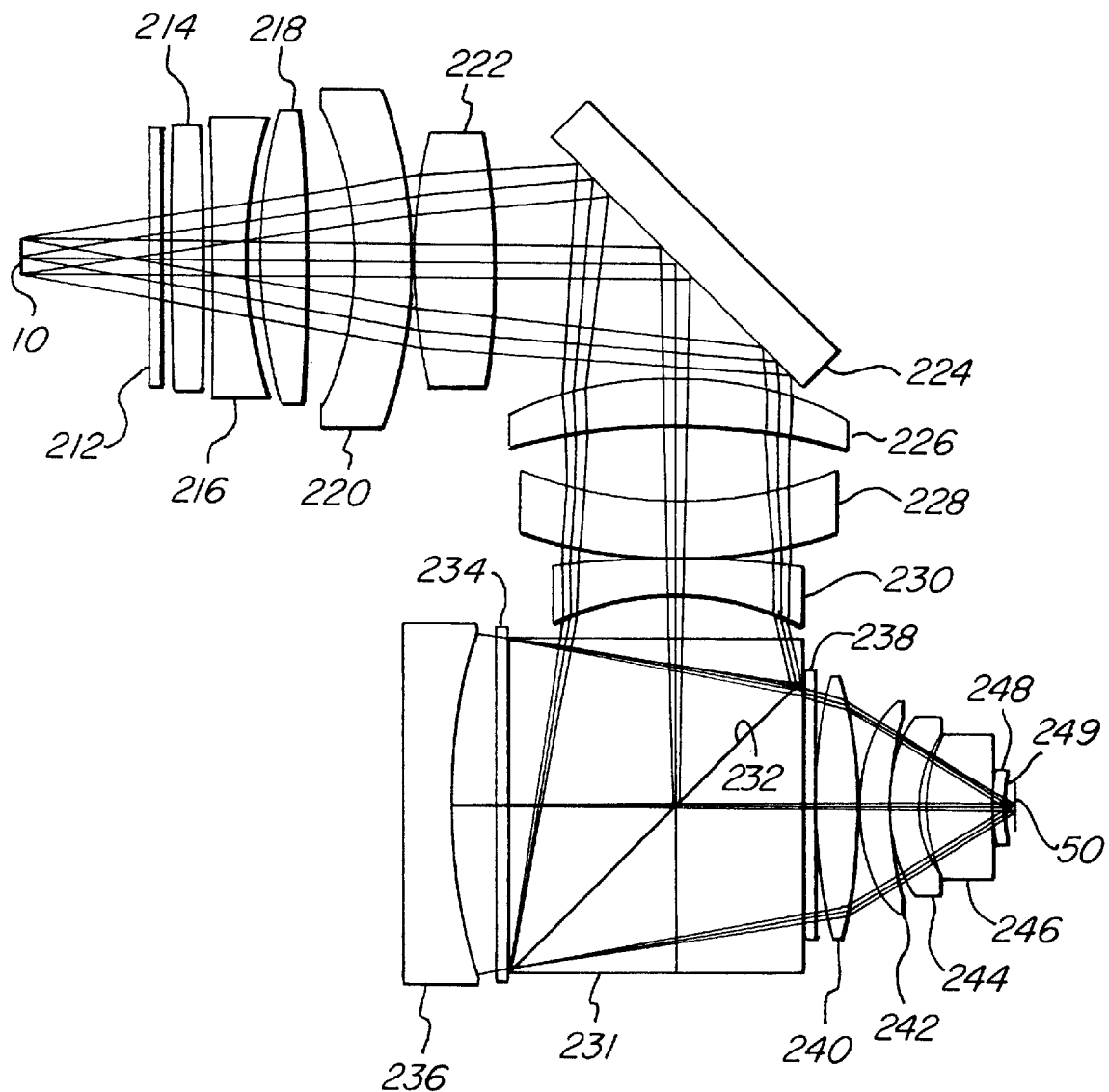
FIG. 3 schematically illustrates a third embodiment of the present invention designed for use with 193 nanometer wavelength electromagnetic radiation and having five aspheric surfaces.

FIG. 3 illustrates a third embodiment of the present invention. This embodiment has a numerical aperture of 0.75, 26×5 mm field at the wafer, and is designed for use with 193 nanometer wavelength electromagnetic radiation over a spectral bandwidth of 25 picometers full-width-half maximum. This, the third embodiment, has five aspheric surfaces for reducing aberrations. Adjacent or following reticle 10 is a quarter waveplate 212. Following quarter waveplate 212 is a planar convex lens 214, and an aspheric lens 216. Aspheric lens 216 has a concave surface and an aspheric surface. Following aspheric lens 216 is a bi-convex lens 218, a meniscus lens 220, and a bi-convex lens 222. Following this first lens group is a fold mirror 224. Following fold mirror 224 is a meniscus lens 226 and an aspheric lens 228. Aspheric lens 228 has a concave aspheric surface and aspherical convex surface. Following aspheric lens 228 is a meniscus lens 230. Following this lens group after the fold mirror 224 is a beamsplitter 231. Beamsplitter 231 has a partially reflective surface 232. Adjacent one side of the beamsplitter 231 is a second quarter waveplate 234. Following the second quarter waveplate 234 is a concave aspheric mirror 236. Adjacent an opposing surface of the beamsplitter 231 is a third quarter waveplate 238 followed by a bi-convex lens 240, a meniscus lens 242, an aspheric lens 244. Aspheric lens 244 has a concave aspheric surface. Following aspheric lens 244 is an aspheric lens 246. Aspheric lens 246 is placed adjacent meniscus lens 248. Lenses 240, 242, 244, and 246 and 248 are made of calcium fluoride. Adjacent lens 248 is a plate 249. Wafer 50 is placed at the image plane following plate 249. In this embodiment, the third embodiment, five aspheric surfaces are used. One in a lens group between the reticle 10 and the fold mirror 224, aspheric lens 216, a second in the lens group between the fold mirror 224 and the beamsplitter 231, aspheric lens 228. The third aspheric surface is located on the concave mirror 236. A fourth aspheric surface is located on aspheric lens 244, with a fifth aspheric surface located on lens 246, both of which are in the lens group between the beamsplitter 231 and the wafer or photosensitive substrate 50. The use of the five aspheric surfaces in this, the third embodiment of the present invention, greatly reduces aberrations.

In a preferred configuration the optical system, illustrated in FIG. 3, may be made according to the construction data of the following Tables 3 and 3A.

TABLE 3

| Element Number | Radius of Curvature(Front)mm | Radius of Curvature(Back)mm | Thickness mm | Glass |
|---|---|---|---|---|
| 10 | Infinite | | 71.0257 | |
| 212 | Infinite | Infinite | 6.0000 | Silica |
| space | | | 5.9995 | |
| 214 | Infinite | −1637.5100 CX | 17.8788 | Silica |
| space | | | 4.5575 | |
| 216 | −1237.3096 CC | A(1) | 19.5803 | Silica |
| space | | | 7.4171 | |
| 218 | 364.2097 CX | −674.5230 CX | 25.6054 | Silica |
| space | | | 25.3077 | |
| 220 | −185.3015 CC | −283.9553 CX | 30.8746 | Silica |
| space | | | 1.5004 | |
| 222 | 332.0965 CX | −480.2185 CX | 42.1200 | Silica |
| 224 | Infinite | | −64.0738 | Reflector |
| 226 | −197.3304 CX | −362.9388 CC | −30.0000 | Silica |
| space | | | −38.3129 | |
| 228 | A(2) | 303.6930 CX | −30.2428 | Silica |
| space | | | −2.0000 | |
| 230 | −686.9764 CX | −140.3749 CC | −19.1575 | Silica |
| space | | | −25.2130 | |
| 231 | Infinite | Infinite | −91.000 | Silica |
| 232 | Infinite | | | Reflector |
| 231 | Infinity | Infinite | 91.0000 | Silica |
| space | | | 1.7156 | |
| 234 | Infinite | Infinite | 6.0000 | Silica |
| space | | | 23.4104 | |
| 236 | A(3) | | −23.4104 | Reflector |
| 234 | Infinite | Infinite | −6.0000 | Silica |
| space | | | −1.7156 | |
| 231 | Infinite | Infinite | −91.0000 | Silica |
| 231 | Infinity | Infinite | −68.0000 | Silica |
| space | | | −1.7156 | |
| 238 | Infinite | Infinite | −4.4503 | Silica |
| space | | | −0.5000 | |
| 240 | −294.3870 CX | 285.2516 CX | −22.3559 | CaF$_2$ |
| space | | | −0.5000 | |
| 242 | −90.0227 CX | −143.4682 CC | −15.3841 | CaF$_2$ |
| space | | | −0.5000 | |
| 244 | −86.3937 CX | A(4) | −16.8094 | CaF$_2$ |
| space | | | −4.2386 | |
| 246 | −91.3982 CX | A(5) | −35.1077 | CaF$_2$ |
| space | | | −1.2404 | |
| 248 | −193.8008 CX | −584.4706 CC | −5.2755 | CaF$_2$ |
| space | | | −1.0000 | |
| 249 | Infinite | Infinite | −0.9000 | Silica |
| | Image Distance = | | −2.3000 | |
| 50 | Infinite | | | |

The aspheric constants are provided according to the following equation and Table 3A

TABLE 3A $$z = \frac{(curv)y^2}{1 + (1 - (1 + K)(curv)^2 y^2)^{1/2}} + (A)y^4 + (B)y^6 + (C)y^8 + (D)y^{10} + (E)y^{12} + (F)y^{14} + (G)y^{16} + (H)y^{18} + (J)y^{20}$$

| Aspheric | Curv | K | A | B | C | D |
|---|---|---|---|---|---|---|
| A(1) | 0.00383949 | 0.000000 | −5.74812E−09 | 1.78952E−13 | 3.56502E−18 | −4.29928E−22 |
| A(2) | 0.00408685 | 0.000000 | 3.46415E−09 | −2.46236E−13 | 2.98339E−21 | 3.46678E−21 |
| A(3) | −0.00290152 | 0.000000 | 1.61839E−09 | 1.11129E−13 | 5.08685E−18 | −5.96371E−23 |
| A(4) | −0.01476551 | 0.000000 | 6.79788E−08 | 2.28037E−11 | 4.76211E−15 | 2.35042E−18 |
| A(5) | −0.00407592 | 0.000000 | −1.85475E−07 | −5.95105E−11 | 2.46369E−14 | −3.41676E−17 |

TABLE 3A-continued $$z = \frac{(\text{curv})y^2}{1 + (1 - (1+K)(\text{curv})^2 y^2)^{1/2}} + (A)y^4 + (B)y^6 + (C)y^8 + (D)y^{10} + (E)y^{12} + (F)y^{14} + (G)y^{16} + (H)y^{18} + (J)y^{20}$$

|      | E | F | G | H | J |
|---|---|---|---|---|---|
| A(1) | 1.07476E−25 | −7.13558E−30 | 0.00000E+00 | 0.00000E+00 | 0.00000E+00 |
| A(2) | −1.14760E−24 | 1.97684E−28 | −1.74440E−32 | 6.27538E−37 | 0.00000E+00 |
| A(3) | 5.45877E−23 | −5.30479E−30 | 3.27535E−34 | −5.74203E−39 | 0.00000E+00 |
| A(4) | −3.36512E−22 | 2.71804E−25 | 0.00000E+00 | 0.00000E+00 | 0.00000E+00 |
| A(5) | 2.68515E−25 | 1.36619E−30 | 0.00000E+00 | 0.00000E+00 | 0.00000E+00 |

Figure 4:
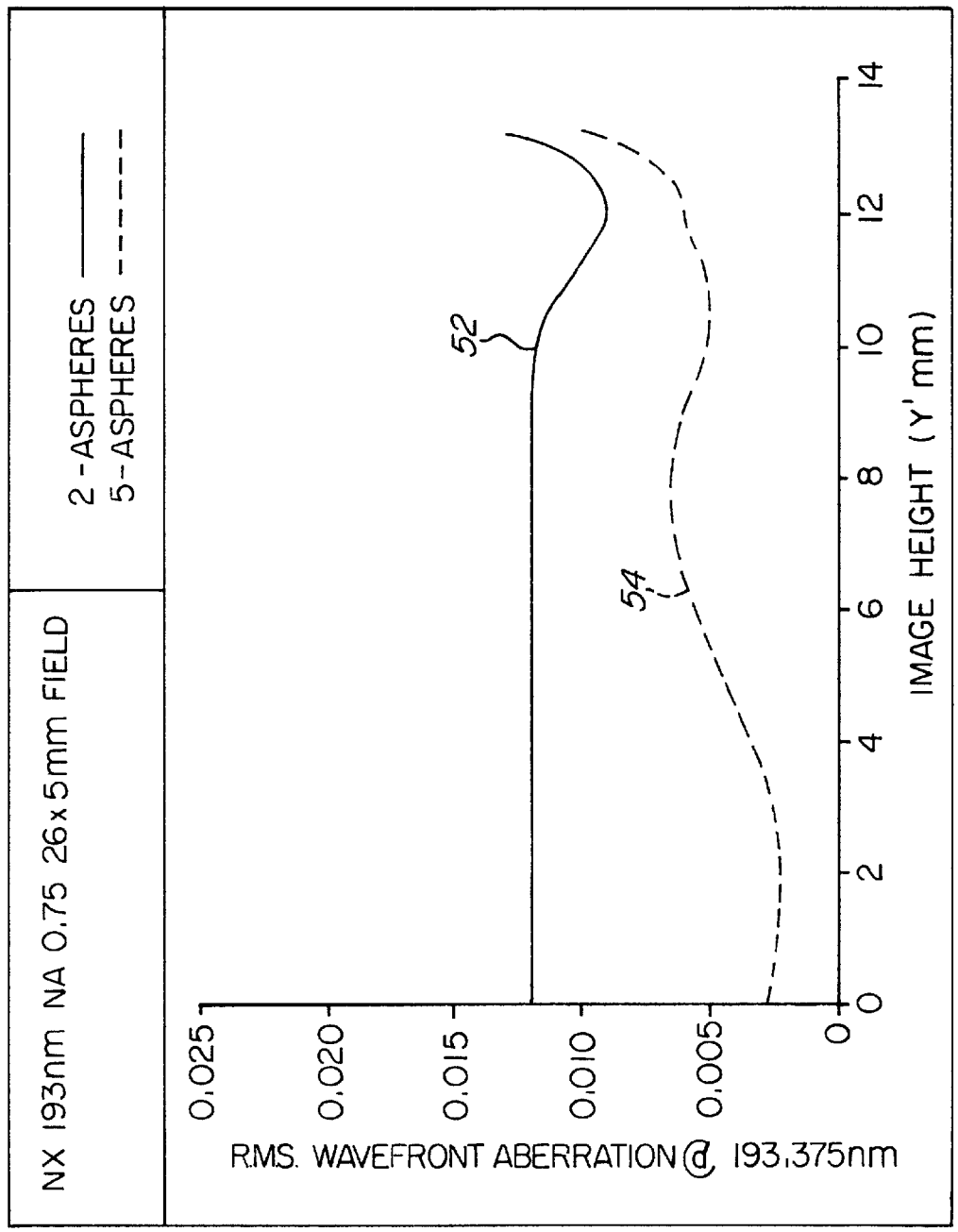
FIG. 4 is a graph comparing the wavefront aberrations as a function of image height of the embodiment illustrated in FIG. 2 and the embodiment illustrated in FIG. 3.

FIG. 4 graphically illustrates wavefront aberrations as a function of image height for the embodiments of the present invention illustrated in FIG. 2 and FIG. 3. Waveform or line 52 illustrates the aberrations as a function of image height for the embodiment illustrated in FIG. 2 having two aspheric surfaces. The waveform or dashed line 54 illustrates the wavefront aberrations as a function of image height for the embodiment having five aspheric surfaces illustrated in FIG. 3. As can readily be appreciated by FIG. 4, the wavefront aberrations are significantly reduced in the embodiment having five aspheric surfaces.

Figure 5:
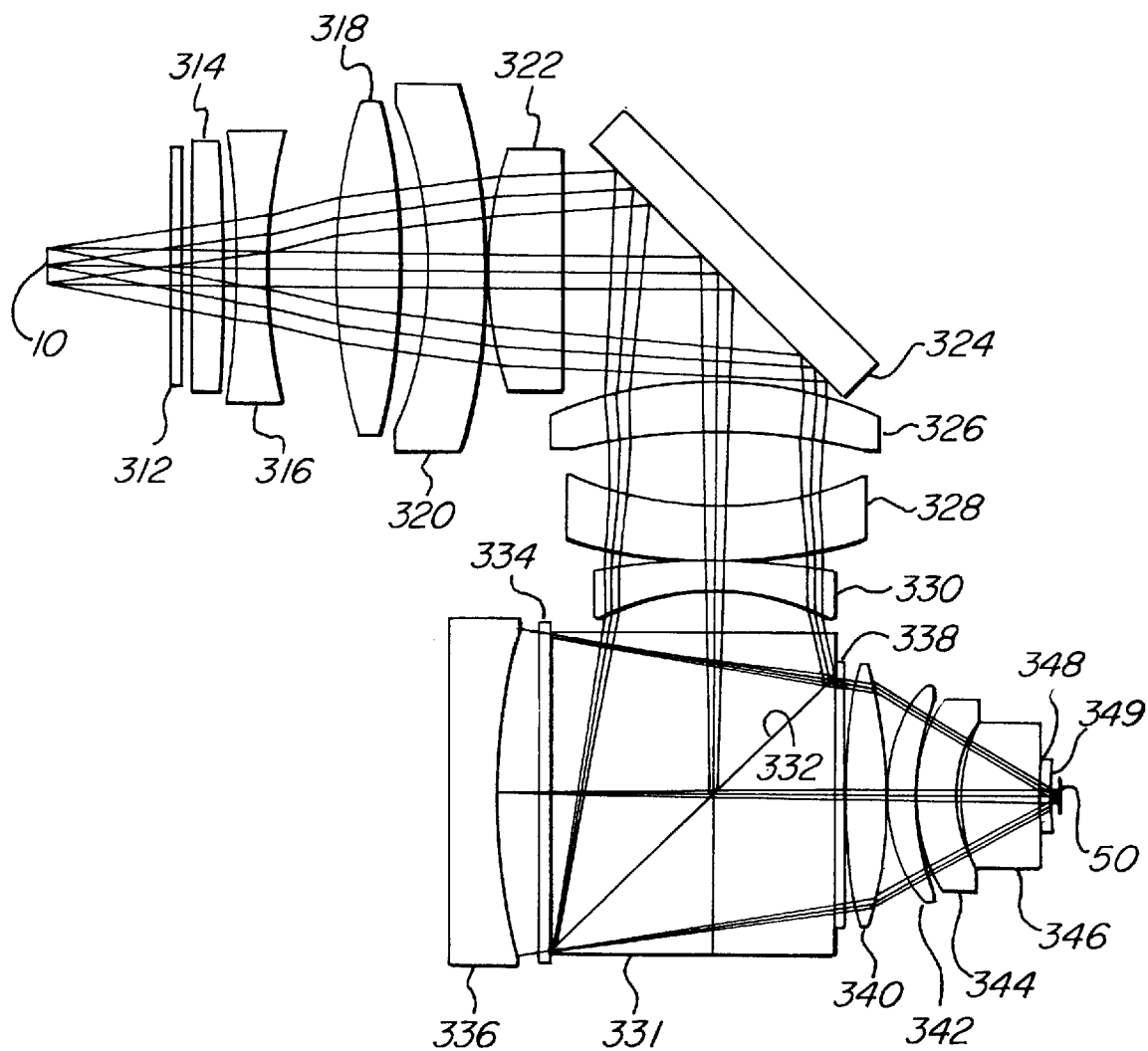
FIG. 5 schematically illustrates a fourth embodiment of the present invention designed for use with 157 nanometer wavelength electromagnetic radiation using calcium fluoride material.

FIG. 5 illustrates a fourth embodiment of the present invention having a numerical aperture of 0.75, 26×5 mm field at the wafer, and designed for use with 157 nanometer wavelength electromagnetic radiation over a spectral bandwidth of 1.5 picometers fill-width-half maximum. This embodiment uses two aspheric surfaces and is made entirely of calcium fluoride. Following reticle 10 is a quarter waveplate 312, a planar convex lens 314, a bi-concave lens 316, a bi-convex lens 318, a meniscus lens 320, and a bi-convex lens 322. Following this lens group is a fold mirror 324. Following fold mirror 324 is a meniscus lens 326, an aspheric lens 328, and a meniscus lens 330. Aspheric lens 328 has a concave aspheric surface. Following this lens group after the fold mirror 324 is a beamsplitter 331. Beamsplitter 331 has a partially reflective surface 332. Adjacent one side of the beamsplitter 331 is a second quarter waveplate 334. Following the second quarter waveplate 334 is an aspherical concave mirror 336. Adjacent a side of the beamsplitter 331 opposing the second quarter waveplate 334 is positioned a third quarter waveplate 338. Following the quarter waveplate 338 is a bi-convex lens 340, a meniscus lens 342, a meniscus lens 344, a meniscus lens 346, and a meniscus lens 348. Adjacent meniscus lens 348 is positioned a plate 349. Plate 349 is adjacent the image plane where a wafer or photosensitive substrate 50 is positioned.

A preferred configuration of the optical system, illustrated in FIG. 5, may be made according to the construction data in the following Tables 4 and 4A.

TABLE 4

| Element Number | Radius of Curvature(Front)mm | Radius of Curvature(Back)mm | Thickness mm | Glass |
|---|---|---|---|---|
| 10 | Infinite | | 71.0257 | |
| 312 | Infinite | Infinite | 6.0000 | CaF$_2$ |
| space | | | 5.9971 | |
| 314 | Infinite | −1637.5100 CX | 17.8788 | CaF$_2$ |
| space | | | 6.8555 | |
| 316 | −601.0743 CC | 337.2385 CC | 19.3530 | CaF$_2$ |
| space | | | 39.1414 | |
| 318 | 372.9672 CX | −444.4615 CX | 35.0514 | CaF$_2$ |
| space | | | 17.5760 | |

TABLE 4-continued

| Element Number | Radius of Curvature(Front)mm | Radius of Curvature(Back)mm | Thickness mm | Glass |
|---|---|---|---|---|
| 320 | −238.7418 CC | −374.7892 CX | 33.5080 | CaF$_2$ |
| space | | | 1.5026 | |
| 322 | 271.2372 CX | −2141.5952 | 41.9745 | CaF$_2$ |
| space | | | 85.7471 | |
| 324 | Infinite | | −64.0738 | Reflector |
| 326 | −218.7966 CX | −378.3046 CC | −30.0000 | CaF$_2$ |
| space | | | −41.2869 | |
| 328 | A(1) | 331.4015 CX | −30.2428 | CaF$_2$ |
| space | | | −2.0021 | |
| 330 | −473.0920 CX | −138.9426 CC | −15.0066 | CaF$_2$ |
| space | | | −25.4542 | |
| 331 | Infinite | Infinite | −91.9338 | CaF$_2$ |
| 332 | Infinite | | | Reflector |
| 331 | Infinite | Infinite | 91.9338 | CaF$_2$ |
| space | | | 1.7156 | |
| 334 | Infinite | Infinite | 6.0000 | CaF$_2$ |
| space | | | 23.9891 | |
| 326 | A(2) | | −23.2891 | Reflector |
| 334 | Infinite | Infinite | −6.0000 | CaF$_2$ |
| space | | | −1.7156 | |
| 331 | Infinite | Infinite | −91.9336 | CaF$_2$ |
| 331 | Infinite | Infinite | −68.0000 | CaF$_2$ |
| space | | | −1.7156 | |
| 328 | Infinite | Infinite | −4.4503 | CaF$_2$ |
| space | | | −0.5000 | |
| 340 | −379.1353 CX | 304.9678 CX | −21.8077 | CaF$_2$ |
| space | | | −0.5000 | |
| 342 | −94.2814 CX | −162.6972 CC | −17.3319 | CaF$_2$ |
| space | | | −1.0800 | |
| 344 | −115.8596 CX | −73.3964 CC | −20.5225 | CaF$_2$ |
| space | | | −3.8075 | |
| 346 | −92.2350 CX | −218.2297 CC | −42.4471 | CaF$_2$ |
| space | | | −1.1466 | |
| 348 | −155.2317 CX | −656.3405 CC | −5.2755 | CaF$_2$ |
| space | | | −1.0000 | |
| 349 | Infinite | Infinite | −0.9000 | CaF$_2$ |
| | Image Distance = | | −2.3000 | |
| 50 | Infinite | | | |

The aspheric constants are provided according to the following equation and Table 4A

TABLE 4A $$z = \frac{(curv)y^2}{1 + (1 - (1 + K)(curv)^2 y^2)^{1/2}} + (A)y^4 + (B)y^6 + (C)y^8 + (D)y^{10} + (E)y^{12} + (F)y^{14} + (G)y^{16} + (H)y^{18} + (J)y^{20}$$

| Aspheric | Curv | K | A | B | C | D |
|---|---|---|---|---|---|---|
| A(1) | 0.00475685 | 0.000000 | 8.25386E−09 | −1.36412E−13 | −4.41072E−17 | 2.29567E−20 |
| A(2) | −0.00272498 | 0.000000 | 1.82601E−09 | 9.56998E−14 | 6.16098E−18 | −4.25832E−22 |

| | E | F | G | H | J |
|---|---|---|---|---|---|
| A(1) | −6.72654E−24 | 1.13058E−27 | −1.00992E−31 | 3.72128E−36 | 0.00000E+00 |
| A(2) | 8.51395E−26 | −7.80032E−30 | 4.75429E−34 | −1.14164E−38 | 0.00000E+00 |

Accordingly, all of the embodiments of the present invention, from a long conjugant end at reticle 10 to a short conjugate end at wafer or photosensitive substrate 50, provide a quarter waveplate following the reticle and a first lens group positioned between the quarter waveplate and a first fold mirror, and a second lens group between the fold mirror and a beamsplitter. In each embodiment, the lens group before the fold mirrors 24, 124, 224, and 324 may be considered a first lens group and the lens group between the fold mirrors 24, 124, 224, and 324 and the beamsplitters 31, 131, 231, and 331 may be considered a second lens group. Alternatively, this first and second lens group may be considered a single lens group. The partially reflective surface on the beamsplitter reflects electromagnetic radiation to a second quarter waveplate and an aspheric concave mirror which reflects electromagnetic radiation back through the beamsplitter and through the partially reflective surface to a third quarter waveplate and through a third lens group to the photosensitive substrate or wafer 50. All of the embodiments provide for the quarter waveplate following the reticle and have a lens with an aspheric surface between the fold mirror and the beamsplitter cube, and have lens elements between the beamsplitter cube and the photosensitive substrate, a majority of which are made of calcium fluoride. Accordingly, the present invention provides a projection optical system having a relatively high numerical aperture with improved imaging characteristics that forms well at wavelengths as short as 157 nanometers. Therefore, the present invention advances the optical arts and greatly facilitates the manufacture of semiconductor devices.

Although the preferred embodiments have been illustrated and described, it should be appreciated by those skilled in the art that various modifications may be made without departing from the spirit and scope of this invention.

What is claimed is:

1. A catadioptric optical projection system for use in projecting a reduced image of a reticle onto a photosensitive surface, from the long conjugate end to the short conjugate end, comprising:

a first lens group;
   a second lens group following said first lens group, one lens in said second lens group having a first aspheric surface;
   a beamsplitter placed adjacent said second lens group;
   a concave mirror placed adjacent said beamsplitter;
   a third lens group placed adjacent said beamsplitter opposite said concave mirror, said third lens group having a majority of the lenses therein made of calcium fluoride, whereby the reduced image of the reticle is projected onto the photosensitive surface.

2. A catadioptric optical projection system as in claim 1 further comprising:

a fold mirror placed between said first lens group and said second lens group.

3. A catadioptric optical projection system as in claim 1 wherein:

said first lens group has a lens with a second aspheric surface.

4. A catadioptric optical projection system as in claim 3 wherein:

said third lens group has a lens with a third aspheric surface.

5. A catadioptric optical projection system as in claim 1 further comprising:

a first quarter waveplate placed between the reticle and said first lens group,
   whereby circularly polarized light is allowed though the reticle avoiding diffraction asymmetry resulting from the relative orientation of reticle features and light polarization vector.

6. A catadioptric optical projection system as in claim 5 further comprising:

a second quarter waveplate placed between said beamsplitter and said concave mirror; and
   a third quarter waveplate placed between said beamsplitter and said third lens group.

7. A catadioptric optical reduction projection system as in claim 6 wherein:

said first, second, and third quarter waveplates are zero-order quarter waveplates.

8. A catadioptric optical reduction projection system as in claim 1 wherein:

said first lens group and second lens group are made of calcium fluoride.

9. A catadioptric optical reduction projection system as in claim 1 wherein:

said concave mirror has an aspheric surface.

10. A catadioptric optical reduction projection system, from the long conjugate end to the short conjugate end, comprising:

a reticle having a plurality of reticle features with different relative orientations;
    a first quarter waveplate placed adjacent said reticle;
    a first lens group;
    a beamsplitter;
    a concave mirror placed adjacent said beamsplitter; and a second lens group placed adjacent said beamsplitter, whereby circularly polarized light is allowed to pass through said reticle avoiding diffraction asymmetry resulting from the different relative orientations of said reticle features.

11. A catadioptric optical reduction projection system as in claim 10 further comprising:

a second quarter waveplate placed between said beamsplitter and said concave mirror; and a third quarter waveplate placed between said beamsplitter opposite said second quarter waveplate and said second lens group.

12. A catadioptric optical reduction projection system as in claim 11 wherein:

said first, second, and third quarter waveplates are zero-order quarter wave plates.

13. A catadioptric optical reduction projection system as in claim 10 wherein:

at least one lens in said first lens group has an aspheric surface.

14. A catadioptric optical reduction projection system, from the long conjugate end to the short conjugate end, comprising:

a reticle having a plurality of reticle features with different relative orientations;

a first quarter waveplate placed adjacent said reticle;

a first lens group;

a beamsplitter;

a concave mirror placed adjacent said beamsplitter; and a second lens group placed adjacent said beamsplitter, said second lens group having a majority of the lenses therein made of calcium fluoride, whereby circularly polarized light is allowed to pass through said reticle avoiding diffraction asymmetry resulting from the different relative orientations of said reticle features.

15. A catadioptric optical reduction projection system, from the long conjugate end to the short conjugate end, comprising:

a reticle having a plurality of reticle features with different relative orientations;

a first quarter waveplate placed adjacent said reticle, whereby circularly polarized light is allowed to pass through said reticle avoiding diffraction asymmetry resulting from the different relative orientations of said reticle features;

a first lens group placed adjacent said first quarter waveplate, at least one lens in said first lens group having a first aspheric surface;

a fold mirror placed adjacent said first lens group;

a second lens group following said first lens group and said fold mirror, at least one lens in said second lens group having a second aspheric surface;

a beamsplitter placed adjacent said second lens group;

a concave mirror placed adjacent said beamsplitter;

a second quarter wave plate placed between said beamsplitter and said concave mirror;

a third lens group placed adjacent said beamsplitter opposite said concave mirror, said third lens group having a majority of the lenses therein made of calcium fluoride, at least one lens in said third lens group having a third aspheric surface; and a third quarter waveplate placed between said beamsplitter and said third lens group, whereby the reduced image of the reticle is projected onto the photosensitive surface.

16. An optical reduction system comprising:

a construction substantially according to the following construction data in Table 1

TABLE 1

| Element Number | Radius of Curvature(Front)mm | Radius of Curvature(Back)mm | Thickness mm | Glass |
|---|---|---|---|---|
| 10 | Infinite | | 71.0257 | |
| 12 | Infinite | Infinite | 6.0000 | Silica |
| space | | | 6.0000 | |
| 14 | Infinite | −1637.5100 CX | 17.8788 | Silica |
| space | | | 7.6907 | |
| 16 | −507.9899 CC | 425.0110 CC | 23.6604 | Silica |
| space | | | 23.6491 | |
| 18 | 482.8744 CX | −334.9535 CX | 32.3037 | Silica |
| space | | | 12.0839 | |
| 20 | −210.1022 CC | −342.7380 CX | 35.5779 | Silica |
| space | | | 1.5001 | |
| 22 | 254.8364 CX | −1377.8565 CX | 38.5079 | Silica |
| space | | | 83.5499 | |
| 24 | Infinite | | −64.0738 | Reflector |
| 26 | −200.6185 CX | −294.6182 CC | −30.0000 | Silica |
| space | | | −33.6639 | |
| 28 | A(1) | 207.0105 CX | −30.2428 | Silica |
| space | | | −1.9989 | |
| 30 | 2223.6648 CC | −166.4311 CC | −27.4282 | Silica |
| space | | | −21.5924 | |
| 31 | Infinity | Infinity | −91.0000 | Silica |
| 32 | Infinity | | | Reflector |
| 31 | Infinity | Infinity | 91.0000 | Silica |
| space | | | 1.7156 | |
| 34 | Infinity | Infinity | 6.000 | Silica |
| space | | | 23.3211 | |
| 36 | A(2) | | −23.3211 | Reflector |
| 34 | Infinity | Infinity | −6.000 | Silica |
| space | | | −1.7156 | |
| 31 | Infinity | Infinity | −91.0000 | Silica |
| 31 | Infinity | Infinity | −68.0000 | Silica |
| space | | | −1.7156 | |
| 38 | Infinity | Infinity | −4.4503 | Silica |
| space | | | −0.5000 | |
| 40 | −627.6194 CX | 211.4176 CX | −21.5127 | CaF$_2$ |
| space | | | −0.5000 | |
| 42 | −87.2228 CX | −200.3029 CC | −19.1435 | CaF$_2$ |
| space | | | −0.5000 | |
| 44 | −91.9856 CX | −59.4578 CC | −27.1671 | Silica |
| space | | | −2.9551 | |
| 46 | −73.3403 CX | −160.4650 CC | −21.3988 | CaF$_2$ |
| space | | | −1.4194 | |
| 48 | −126.8033 CX | −368.0257 CC | −5.2755 | CaF$_2$ |
| space | | | −1.0000 | |
| 49 | Infinity | Infinity | −0.9000 | Silica |
| | Image Distance = | | −2.3000 | |
| 50 | Infinity | | | | and the aspheric constants A(1) and A(2) are provided according to the following equation and Table 1A

TABLE 1A $$z = \frac{(curv)y^2}{1 + (1 - (1 + K)(curv)^2 y^2)^{1/2}} + (A)y^4 + (B)y^6 + (C)y^8 + (D)y^{10} + (E)y^{12} + (F)y^{14} + (G)y^{16} + (H)y^{18} + (J)y^{20}$$

| Aspheric | Curv | K | A | B | C | D |
|---|---|---|---|---|---|---|
| A(1) | 0.00497390 | 0.000000 | 2.35640E−08 | −7.81654E−14 | −4.40789E−17 | 2.12263E−20 |
| A(2) | −0.00289239 | 0.000000 | 2.36370E−09 | 1.65324E−13 | 7.69607E−18 | 9.96953E−23 |

| Aspheric | E | F | G | H | J |
|---|---|---|---|---|---|
| A(1) | −6.05312E−24 | 9.94327E−28 | −8.75026E−28 | 3.18657E−36 | 0.00000E+00 |
| A(2) | 4.61249E−26 | −3.24220E−30 | 2.06573E−34 | −4.86011E−40 | 0.00000E+00 | whereby an image field is formed.

17. An optical reduction system comprising:

a construction substantially according to the following construction data in Table 2

TABLE 2

| Element Number | Radius of Curvature(Front)mm | Radius of Curvature(Back)mm | Thickness mm | Glass |
|---|---|---|---|---|
| 10 | Infinite | | 71.0257 | |
| 112 | Infinity | Infinity | 6.0000 | Silica |
| space | | | 6.0014 | |
| 114 | Infinity | −1637.5100 CX | 17.8788 | Silica |
| space | | | 9.1702 | |
| 116 | −433.0968 CC | 2598.0412 CC | 29.3027 | Silica |
| space | | | 28.9382 | |
| 118 | −5578.3482 CC | −382.9273 CX | 29.8579 | Silica |
| space | | | 16.6017 | |
| 120 | −189.0676 CC | −239.8621 CX | 18.0000 | Silica |
| space | | | 1.5014 | |
| 122 | 259.603 CX | −2163.768 CX | 37.8249 | Silica |
| space | | | 86.0743 | |
| 124 | Infinity | | −64.0738 | Reflector |
| 126 | −200.8102 CX | −363.2248 CC | −28.2406 | Silica |
| space | | | −48.5160 | |
| 128 | A(1) | 215.5519 CX | −30.2428 | Silica |
| space | | | −2.0011 | |
| 130 | −718.0642 CX | −142.9228 CC | −12.1060 | Silica |
| space | | | −23.8197 | |
| 131 | Infinity | Infinity | −91.0000 | Silica |
| 132 | Infinity | | | Reflector |
| 131 space | Infinity | Infinity | 91.0000 1.7156 | Silica |

TABLE 2-continued

| Element Number | Radius of Curvature(Front)mm | Radius of Curvature(Back)mm | Thickness mm | Glass |
|---|---|---|---|---|
| 134 | Infinity | Infinity | 6.0000 | Silica |
| space | | | 25.1737 | |
| 136 | A(2) | | −25.1737 | Reflector |
| 134 | Infinity | Infinity | −6.0000 | Silica |
| space | | | −1.7156 | |
| 131 | Infinity | Infinity | −91.0000 | Silica |
| 131 space | Infinity | Infinity | −68.000 −1.7156 | Silica |
| 138 | Infinity | Infinity | −4.4503 | Silica |
| space | | | −0.5000 | |
| 140 | −366.1837 CX | 259.6264 CX | −22.6130 | CaF₂ |
| space | | | −0.5000 | |
| 142 | −85.8999 CX | −176.3075 CC | −19.0232 | CaF₂ |
| space | | | −0.5000 | |
| 144 | −86.4495 CX | −64.6738 CC | −15.3239 | CaF₂ |
| space | | | −5.5180 | |
| 146 | −100.7188 CX | −180.9651 CC | −31.1363 | CaF₂ |
| space | | | −1.2329 | |
| 148 | −138.0675 CX | −502.9595 CC | −5.2755 | CaF₂ |
| space | | | −1.0000 | |
| 149 | Infinity | Infinity | −0.9000 −2.3000 | Silica |
| 50 | Image Distance = Infinity | | | | and the aspheric constants A(1) and A(2) are provided according to the following equation and Table 2A

TABLE 2A $$z = \frac{(curv)y^2}{1 + (1 - (1 + K)(curv)^2 y^2)^{1/2}} + (A)y^4 + (B)y^6 + (C)y^8 + (D)y^{10} + (E)y^{12} + (F)y^{14} + (G)y^{16} + (H)y^{18} + (J)y^{20}$$

| Aspheric | Curv | K | A | B | C | D |
|---|---|---|---|---|---|---|
| A(1) | 0.00576125 | 0.000000 | 3.60293E−09 | −4.18487E−13 | −4.80164E−17 | 1.86225E−20 |
| A(2) | −0.00288476 | 0.000000 | 1.74269E−09 | 1.17255E−13 | 6.94898E−18 | −2.48358E−22 |

TABLE 2A-continued $$z = \frac{(\text{curv})y^2}{1 + (1 - (1+K)(\text{curv})^2 y^2)^{1/2}} + (A)y^4 + (B)y^6 + (C)y^8 + (D)y^{10} + (E)y^{12} + (F)y^{14} + (G)y^{16} + (H)y^{18} + (J)y^{20}$$

|      | E            | F            | G            | H            | J           |
|------|--------------|--------------|--------------|--------------|-------------|
| A(1) | −5.22691E−24 | 8.72143E−28  | −7.89947E−32 | 2.97093E−36  | 0.00000E+00 |
| A(2) | 7.10580E−26  | −5.86680E−30 | 3.49595E−34  | −6.83625E−39 | 0.00000E+00 | whereby an image field is formed.

18. An optical reduction system comprising:

a construction substantially according to the following construction data in Table 3

TABLE 3

| Element Number | Radius of Curvature(Front)mm | Radius of Curvature(Back)mm | Thickness mm | Glass |
|---|---|---|---|---|
| 10 | Infinite | | 71.0257 | |
| 212 | Infinite | Infinite | 6.0000 | Silica |
| space | | | 5.9995 | |
| 214 | Infinite | −1637.5100 CX | 17.8788 | Silica |
| space | | | 4.5575 | |
| 216 | −1237.3096 CC | A(1) | 19.5803 | Silica |
| space | | | 7.4171 | |
| 218 | 364.2097 CX | −674.5230 CX | 25.6054 | Silica |
| space | | | 25.3077 | |
| 220 | −185.3015 CC | −283.9553 CX | 30.8746 | Silica |
| space | | | 1.5004 | |
| 222 | 332.0965 CX | −480.2185 CX | 42.1200 | Silica |
| 224 | Infinite | | −64.0738 | Reflector |
| 226 | −197.3304 CX | −362.9388 CC | −30.0000 | Silica |
| space | | | −38.3129 | |
| 228 | A(2) | 303.6930 CX | −30.2428 | Silica |
| space | | | −2.0000 | |
| 230 | −686.9764 CX | −140.3749 CC | −19.1575 | Silica |
| space | | | −25.2130 | |
| 231 | Infinite | Infinite | −91.000 | Silica |
| 232 | Infinite | Infinite | | Reflector |
| 231 space | Infinity | Infinite | 91.0000 1.7156 | Silica |

TABLE 3-continued

| Element Number | Radius of Curvature(Front)mm | Radius of Curvature(Back)mm | Thickness mm | Glass |
|---|---|---|---|---|
| 234 | Infinite | Infinite | 6.0000 | Silica |
| space | | | 23.4104 | |
| 236 | | A(3) | −23.4104 | Reflector |
| 234 | Infinite | Infinite | −6.0000 | Silica |
| space | | | −1.7156 | |
| 231 | Infinite | Infinite | −91.0000 | Silica |
| 231 | Infinity | Infinite | −68.0000 | Silica |
| space | | | −1.7156 | |
| 238 | Infinite | Infinite | −4.4503 | Silica |
| space | | | −0.5000 | |
| 240 | −294.3870 CX | 285.2516 CX | −22.3559 | CaF₂ |
| space | | | −0.5000 | |
| 242 | −90.0227 CX | −143.4682 CC | −15.3841 | CaF₂ |
| space | | | −0.5000 | |
| 244 | −86.3937 CX | A(4) | −16.8094 | CaF₂ |
| space | | | −4.2386 | |
| 246 | −91.3982 CX | A(5) | −35.1077 | CaF₂ |
| space | | | −1.2404 | |
| 248 | −193.8008 CX | −584.4706 CC | −5.2755 | CaF₂ |
| space | | | −1.0000 | |
| 249 | Infinite | Infinite | −0.9000 | Silica |
| | Image Distance = | | −2.3000 | |
| 50 | Infinite | | | | and the aspheric constants A(1), A(2), A(3), A(4), and A(5) are provided according to the following equation and Table 3A

TABLE 3A $$z = \frac{(\text{curv})y^2}{1 + (1 - (1+K)(\text{curv})^2 y^2)^{1/2}} + (A)y^4 + (B)y^6 + (C)y^8 + (D)y^{10} + (E)y^{12} + (F)y^{14} + (G)y^{16} + (H)y^{18} + (J)y^{20}$$

| Aspheric | Curv | K | A | B | C | D |
|---|---|---|---|---|---|---|
| A(1) | 0.00383949 | 0.000000 | −5.74812E−09 | 1.78952E−13 | 3.56502E−18 | −4.29928E−22 |
| A(2) | 0.00408685 | 0.000000 | 3.46415E−09 | −2.46236E−13 | 2.98339E−21 | 3.46678E−21 |
| A(3) | −0.00290152 | 0.000000 | 1.61839E−09 | 1.11129E−13 | 5.08685E−18 | −5.96371E−23 |
| A(4) | −0.01476551 | 0.000000 | 6.79788E−08 | 2.28037E−11 | 4.76211E−15 | 2.35042E−18 |
| A(5) | −0.00407592 | 0.000000 | −1.85475E−07 | −5.95105E−11 | 2.46369E−14 | −3.41676E−17 |

|      | E            | F            | G            | H            | J           |
|------|--------------|--------------|--------------|--------------|-------------|
| A(1) | 1.07476E−25  | −7.13558E−30 | 0.00000E+00  | 0.00000E+00  | 0.00000E+00 |
| A(2) | −1.14760E−24 | 1.97684E−28  | −1.74440E−32 | 6.27538E−37  | 0.00000E+00 |
| A(3) | 5.45877E−23  | −5.30479E−30 | 3.27535E−34  | −5.74203E−39 | 0.00000E+00 |
| A(4) | −3.36512E−22 | 2.71804E−25  | 0.00000E+00  | 0.00000E+00  | 0.00000E+00 |
| A(5) | 2.68515E−25  | 1.36619E−30  | 0.00000E+00  | 0.00000E+00  | 0.00000E+00 | whereby an image field is formed.

19. An optical reduction system comprising:
a construction substantially according to the following construction data in Table 4

TABLE 4

| Element Number | Radius of Curvature(Front)mm | Radius of Curvature(Back)mm | Thickness mm | Glass |
|---|---|---|---|---|
| 10 | Infinite | | 71.0257 | |
| 312 | Infinite | Infinite | 6.0000 | CaF$_2$ |
| space | | | 5.9971 | |
| 314 | Infinite | −1637.5100 CX | 17.8788 | CaF$_2$ |
| space | | | 6.8555 | |
| 316 | −601.0743 CC | 337.2385 CC | 19.3530 | CaF$_2$ |
| space | | | 39.1414 | |
| 318 | 372.9672 CX | −444.4615 CX | 35.0514 | CaF$_2$ |
| space | | | 17.5760 | |
| 320 | −238.7418 CC | −374.7892 CX | 33.5080 | CaF$_2$ |
| space | | | 1.5026 | |

TABLE 4-continued

| Element Number | Radius of Curvature(Front)mm | Radius of Curvature(Back)mm | Thickness mm | Glass |
|---|---|---|---|---|
| 322 | 271.2372 CX | −2141.5952 | 41.9745 | CaF$_2$ |
| space | | | 85.7471 | |
| 324 | Infinite | | −64.0738 | Reflector |
| 326 | −218.7966 CX | −378.3046 CC | −30.0000 | CaF$_2$ |
| space | | | −41.2869 | |
| 328 | A(1) | 331.4015 CX | −30.2428 | CaF$_2$ |
| space | | | −2.0021 | |
| 330 | −473.0920 CX | −138.9426 CC | −15.0066 | CaF$_2$ |
| space | | | −25.4542 | |
| 331 | Infinite | Infinite | −91.9338 | CaF$_2$ |
| 332 | Infinite | | | Reflector |
| 331 | Infinite | Infinite | 91.9338 | CaF$_2$ |
| space | | | 1.7156 | |
| 334 | Infinite | Infinite | 6.0000 | CaF$_2$ |
| space | | | 23.9891 | |
| 326 | A(2) | | −23.2891 | Reflector |
| 334 | Infinite | Infinite | −6.0000 | CaF$_2$ |
| space | | | −1.7156 | |
| 331 | Infinite | Infinite | −91.9336 | CaF$_2$ |
| 331 | Infinite | Infinite | −68.0000 | CaF$_2$ |
| space | | | −1.7156 | |
| 328 | Infinite | Infinite | −4.4503 | CaF$_2$ |
| space | | | −0.5000 | |

TABLE 4-continued

| Element Number | Radius of Curvature(Front)mm | Radius of Curvature(Back)mm | Thickness mm | Glass |
|---|---|---|---|---|
| 340 | −379.1353 CX | 304.9678 CX | −21.8077 | CaF$_2$ |
| space | | | −0.5000 | |
| 342 | −94.2814 CX | −162.6972 CC | −17.3319 | CaF$_2$ |
| space | | | −1.0800 | |
| 344 | −115.8596 CX | −73.3964 CC | −20.5225 | CaF$_2$ |
| space | | | −3.8075 | |
| 346 | −92.2350 CX | −218.2297 CC | −42.4471 | CaF$_2$ |
| space | | | −1.1466 | |
| 348 | −155.2317 CX | −656.3405 CC | −5.2755 | CaF$_2$ |
| space | | | −1.0000 | |
| 349 | Infinite | Infinite | −0.9000 | CaF$_2$ |
| | Image Distance = | | −2.3000 | |
| 50 | Infinite | | | | and the aspheric constants A(1) and A(2) are provided according to the following equation and Table 4A

TABLE 4A $$z = \frac{(\text{curv})y^2}{1+(1-(1+K)(\text{curv})^2 y^2)^{1/2}} + (A)y^4 + (B)y^6 + (C)y^8 + (D)y^{10} + (E)y^{12} + (F)y^{14} + (G)y^{16} + (H)y^{18} + (J)y^{20}$$

| Aspheric | Curv | K | A | B | C | D |
|---|---|---|---|---|---|---|
| A(1) | 0.00475685 | 0.000000 | 8.25386E−09 | −1.36412E−13 | −4.41072E−17 | 2.29567E−20 |
| A(2) | −0.00272498 | 0.000000 | 1.82601E−09 | 9.56998E−14 | 6.16098E−18 | −4.25832E−22 |

| | E | F | G | H | J |
|---|---|---|---|---|---|
| A(1) | −6.72654E−24 | 1.13058E−27 | −1.00992E−31 | 3.72128E−36 | 0.00000E+00 |
| A(2) | 8.51395E−26 | −7.80032E−30 | 4.75429E−34 | −1.14164E−38 | 0.00000E+00 | whereby an image field is formed.

20. A catadioptric optical reduction projection system, from the long conjugate end to the short conjugate end, comprising:
a reticle having a plurality of reticle features with different relative orientations
a first lens group;
a first quarter waveplate placed between said reticle and said first lens group;
a beamsplitter;
a concave mirror;
a second quarter waveplate placed between said concave mirror and said beamsplitter;
a second lens group;
a third quarter waveplate placed between said beamsplitter and said second lens group; and
a photosensitive substrate adjacent said second lens group,
whereby circularly polarized light is allowed to pass through said reticle avoiding diffraction asymmetry resulting from the different relative orientations of said reticle features and an image of said reticle at the long conjugate end is projected onto said photosensitive substrate at the short conjugate end.

* * * * *